(12) United States Patent
Lima et al.

(10) Patent No.: US 6,408,202 B1
(45) Date of Patent: Jun. 18, 2002

(54) TRANSESOPHAGEAL MAGNETIC RESONANCE ANALYSIS METHOD AND APPARATUS

(75) Inventors: Joao A. C. Lima, Timonium; Kendrick A. Shunk, Baltimore; Ergin Atalar, Columbia, all of MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/432,960

(22) Filed: Nov. 3, 1999

Related U.S. Application Data (60) Provisional application No. 60/106,772, filed on Nov. 3, 1998.

(51) Int. Cl.$^7$ ................................................. A61B 5/05
(52) U.S. Cl. ....................... 600/423; 600/410; 600/421; 600/380; 324/307; 324/322
(58) Field of Search ................................ 600/373, 380, 600/160, 417, 421, 422, 423, 424; 324/307, 318, 322; 607/154, 156

(56) References Cited

U.S. PATENT DOCUMENTS

| | | |
|---|---|---|
| 4,572,198 A | 2/1986 | Codrington |
| 5,050,607 A | 9/1991 | Bradley et al. |
| 5,154,179 A | 10/1992 | Ratner |
| 5,170,789 A | 12/1992 | Narayan et al. |
| 5,211,166 A | 5/1993 | Sepponen |
| 5,348,010 A | 9/1994 | Schnall et al. |
| 5,355,087 A | 10/1994 | Claiborne et al. |
| 5,417,713 A | 5/1995 | Cohen |
| 5,419,325 A | 5/1995 | Dumoulin et al. |
| 5,432,450 A | 7/1995 | Rubinson |
| 5,546,951 A * | 8/1996 | Ben-Haim |
| 5,699,801 A | 12/1997 | Atalar et al. |
| 5,792,055 A | 8/1998 | McKinnon |
| 5,928,145 A | 7/1999 | Ocali et al. |
| 6,120,442 A * | 9/2000 | Hickey |

OTHER PUBLICATIONS

Thomas, A.C., et al., "Potential errors in the estimation of coronary arterial stenosis from clinical arteriography with reference to the shape of the coronary arterial lumen," *British Heart Journal,* 1986, pp. 129–139, vol. 55.

Zerhouni, E.A., et al., "Human heart: tagging with MR imaging—a method for noninvasive assessment of myocardial motion," *Radiology,* 1988, pp. 59–63, vol. 169.

Narayan, P., et al., "Transrectal probe for $^1$H and $^{31}$P MR spectroscopy of the prostate gland," *Magnetic Resonance in Medicine,* 1989, pp. 209–220, vol. 11.

Schnall, M.D., et al., "Prostate: MR imaging with an endorectal with an endorectal surface coil," *Radiology,* 1989, pp. 570–574, vol. 172.

Witteman, J.C., et al., "Aortic calcified plaques and cardiovascular disease (the Framingham Study)," *American Journal of Cardiology,* 1990, pp. 1060–1064, vol. 66.

(List continued on next page.)

*Primary Examiner*—Marvin M. Lateef
*Assistant Examiner*—Runa Shah Qaderi
(74) *Attorney, Agent, or Firm*—Kirk D. Houser; Eckert Seamans Cherin & Mellott, LLC (57) ABSTRACT

A method of transesophageal magnetic resonance analysis of a patient, such as an animal or human, includes providing a loopless antenna formed from a flexible coaxial cable having an extended center conductor at the distal end thereof. A distal portion of the loopless antenna is secured within a Levin-type gastric tube. The gastric tube which receives the loopless antenna is inserted in the esophagus of the patient. A tuning, matching and decoupling circuit for the loopless antenna is employed external to the patient. The tuning, matching and decoupling circuit is electrically connected to a magnetic resonance imaging scanner. The magnetic resonance imaging scanner is employed to display an image of the aorta of the patient.

51 Claims, 7 Drawing Sheets

OTHER PUBLICATIONS

McVeigh, E.R., et al., "Cardiac tagging with breath–hold cine MRI," *Magnetic Resonance in Medicine,* 1992, pp. 318–327, vol. 28.

Fazio, G.P., et al., "Transesophageal echocardiographically detected atherosclerotic aortic plaque is a marker for coronary artery disease," *Journal of the American College of Cardiology,* 1993, pp. 144–150, vol. 21.

Amarenco, P., et al., "Atherosclerotic disease of the aortic arch and the risk of ischemic stroke," *New England Journal of Medicine,* 1994, pp. 1474–1479, vol. 331.

Atalar, E., et al., "Minimization of dead–periods in MRI pulse sequences for imaging oblique planes," *Magnetic Resonance in Medicine,* 1994, pp. 773–777, vol. 32.

Libby, P., "Lesion versus lumen," *Nature Medicine,* 1995, pp. 17–18, vol. 1.

Martin, A.J., et al., "High–resolution MR imging of human arteries," *Journal of Magnetic Resonance Imaging,* 1995, pp. 93–100, vol. 5.

Toussaint, J.F., et al., "$T_2$–weighted contrast for NMR characterization of human atherosclerosis,"*Arteriosclerosis, Thrombosis and Vascular Biology,* 1995, pp. 1533–1542, vol. 15.

Kasprzak, J.D., et al., "Three–dimensional echocardiography of the thoracis aorta," *European Heart Journal,* 1996, pp. 1584–1592, vol. 17.

Montgomery, D.H., et al., "Natural history of severe atheromatous disease of the thoracic aorta: a transesophageal echocardiographic study," *Journal of the American College of Cardiology,* 1996, pp. 95–101, vol. 27.

Toussaint, J.F., "Magnetic resonance images lipid, fibrous, calcified, hemmorrhagic, and thrombotic components of human atherosclerosis in vivo," *Circulation,* 1996, pp. 932–938, vol. 94.

Atalar, E., et al., "High resolution intravascular MRI and MRS using a catheter receiver coil," *Magnetic Resonance in Medicine,* 1996, pp. 596–605, vol. 36.

Tomochika, Y., et al., "Improvement of atherosclerosis and stiffness of the thoracic descending aorta with cholesterol–lowering therapies in familial hypercholesterolemia," *Arteriosclerosis, Thrombosis and Vascular Biology,* 1996, pp. 955–962, vol. 16.

Martin, A.J., et al., "Arterial imaging: comparison of high–resolution US and MR imaging with histologic correlation," *Radiographics,* 1997, pp. 189–202, vol. 17.

Cohen, A., et al., "Aortic plaque morphology and vascular events: a follow–up study in patients with ischemic stroke. FAPS Investigators. French Study of Aortic Plaques in Stroke," *Circulation,* 1997, pp. 3838–3841, vol. 96.

Siegelman, E.S., et al., "High–resolution MR imaging of the vagina," *Radiographics,* 1997, pp. 1183–1203, vol. 17.

Ocali, O., et al., "Intravascular magnetic resonance imaging using a loopless catheter antenna," *Magnetic Resonance in Medicine,* 1997, pp. 112–118, vol. 37.

Toussaint, J.F., "Water diffusion properties of human atherosclerosis and thrombosis measured by pulse field gradient nuclear magnetic resonance," *Arteriosclerosis, Thrombosis and Vascular Biology,* 1997, pp. 542–546, vol. 17.

Correia, L.C.L., et al., "Intravascular magnetic resonance imaging of aortic atherosclerotic plaque composition,"*Arteriosclerosis, Thrombosis and Vascular Biology,* 1997, pp. 3626–3632, vol. 17.

Matsumura, Y., et al., "Atherosclerotic aortic plaque detected by transesophageal echocardiography: its significance and limitation as a marker for coronary artery disease in the elderly," *Chest,* 1997, pp. 81–86, vol. 112.

Khoury, Z., t al., "Frequency and distribution of atherosclerotic plaques in the thoracic aorta as determined by transesophageal echocardiography in patients with coronary artery disease," *American Journal of Cardiology,* 1997, pp. 23–27, vol. 79.

Yuan, C., et al. "In vitro and in situ magnetic resonance imaging signal features of atherosclerotic plaque–associated lipids," *Arteriosclerosis, Thrombosis and Vascular Biology,* 1997, pp. 1496–503, vol. 17.

Constantinides, C.D., et al., Signal–to–noise measurement in magnitude imaging from NMR phased arrays, *Magnetic Resonance in Medicine,* 1997, pp. 852–857, vol. 38.

Martin, A.J., et al., "An expandable intravenous RF coil for arterial wall imaging," *Journal of Magnetic Resonance Imaging,* 1998, pp. 226–234, vol. 8.

Atalar, E., et al., "Catheter–tracking FOV MR fluoroscopy," *Magnetic Resonance in Medicine,* Dec. 198, pp. 865–872, vol. 40(6).

Ferrari, E., et al., Atherosclerosis of the thoracic aorta and aortic debris in a marker of poor prognosis: benefit of oral anticoagulants, *Journal of the American College of Cardiology,* Apr. 1999, pp. 1317–1322, vol. 33.

* cited by examiner

TRANSESOPHAGEAL MAGNETIC RESONANCE ANALYSIS METHOD AND APPARATUS

CROSS REFERENCE TO RELATED APPLICATION

This application claims the benefit of U.S. Provisional Application Serial No. 60/106,772, filed Nov. 3, 1998.

This invention was made with government support under Grant #R29 HL 57483, Grant #5T32 HL07227-21, Grant #R01 HL45090, and Grant #N01 HC95162, awarded by the National Institutes of Health. The government has certain rights in the invention.

BACKGROUND OF THE INVENTION

1. Field of the Invention

The invention is directed to methods of magnetic resonance analysis and, in particular, to such methods for magnetic resonance imaging and spectroscopic analysis of intra thoracic anatomic structures, such as the aorta, from the esophagus of a patient. The invention is also related to a magnetic resonance analysis apparatus.

2. Description of the Prior Art

Current standard techniques for imaging the thoracic aorta include X-ray computed tomography (CT), standard magnetic resonance imaging (MRI) (e.g., body-coil MRI), transesophageal echocardiography (TEE), and contrast aortography. Each of these techniques suffers some important limitation in its ability to allow detailed mapping of the aortic wall and its anatomic and functional lesions.

Standard MRI and CT lack adequate resolution of the aortic wall for precise characterization of aortic atheromata in vivo, and are not able to provide measurements of focal variations in vessel wall compliance or distensibility (e.g., aortic wall tissue tagging information).

TEE allows real time imaging, but suffers from both an inability to image clearly that portion of the aortic wall which is directly against the esophagus due to the near field effect of ultrasound (e.g., portions of the thoracic aortic wall, particularly in the arch), and from an inability to register images to a fixed frame of reference, making precise mapping of aortic lesions problematic. Kasprzak, J. D., et al., Three-dimensional echocardiography of the thoracic aorta, *Eur. Heart. J.*, vol. 17, pp. 1584–92, 1996, discloses an attempt to circumvent this limitation using a technique to control movements of the probe while imaging in multiple planes with subsequent off-line 3-D image reconstruction. It is believed that the system is relatively cumbersome and not fully successful in obtaining "adequate" images in a select group of 21 patients.

Montgomery, D. H., et al., Natural history of severe atheromatous disease of the thoracic aorta: a transesophageal echocardiographic study, *J. Am. Coll. Cardiol.*, vol. 27, pp. 95–101, 1996, discloses an example of a sermiquantitative atherosclerosis grading scheme which depends upon orthogonal views to estimate the three-dimensional characteristics of aortic lesions, but does not circumvent the inherent advantage of MR over ultrasound imaging at defining atheroma structure. See, for example, Martin, A. J., et al., Arterial imaging: comparison of high-resolution US and MR imaging with histologic correlation, *Radiographics*, vol. 17, pp. 189–202, 1997.

Contrast aortography, which is often considered to provide one of the best standards for aortic imaging, is actually a misnomer since none of the tissues which make up the aortic wall are visualized directly. Instead, only lesions which protrude into the lumen and focally displace the contrast agent can be "seen" as an absence of signal. Any inferences about the vessel wall depend upon a comparison of contrast displacement from the area of the lesion to the displacement around an adjacent "reference" segment of normal artery, which is often unavailable. See, for example, Thomas, A. C., et al., Potential errors in the estimation of coronary arterial stenosis from clinical arteriography with reference to the shape of the coronary arterial lumen, *Br. Heart J*, vol 55, pp. 144–150, 1993. It is believed that any statements about the thickness and stiffness of the vessel wall at the site of a contrast filling defect are purely conjectural.

For these reasons, some investigators prefer the term lumenography to describe standard contrast angiography in general (of which contrast aortography is a specific example). Libby, P., Lesion versus lumen, *Nature Medicine*, vol. 1, pp., 17, 18, 1995.

MRI has a distinct advantage over TEE in that tissue characterization is possible. See, for example, Toussaint, J. F., et al., Magnetic resonance images lipid, fibrous, calcified, hemorrhagic, and thrombotic components of human atherosclerosis in vivo, *Circulation*, vol. 94, pp. 932–38, 1996; and Correia, L. C. L., et al. By performing MRI using an intravascular receiver, higher resolution imaging can be achieved at the cost of invasiveness. See, for example, Ocali, O., et al.; Martin, A. J., et al., *J Magn Reson Imaging*, vol. 8, pp. 226–34; Martin, A. J., et al., *Radiographics*, vol. 17, pp. 189–202; and Atalar, E., et al., *Magn Reson Med*, vol. 36, pp. 596–605.

Intravascular MR has overcome many of the limitations of CT and standard MRI at the cost of invasiveness. Martin, A. J., et al., High-resolution MR imaging of human arteries, *J. Magn. Resort. Imaging*, vol. 5, pp. 93–100, 1995, discloses an intra-aortic catheter coil which is employed to image the aortic wall in a pig model, although the coil is relatively large and requires ligation of the aorta.

Atalar, E., et al., High resolution intravascular MRI and MRS using a catheter receiver coil, *Magn. Reson. Med.*, vol. 36,pp. 596–605, 1996, discloses a 9 French (i.e., 3 mm outer diameter) catheter coil designed specifically for intravascular imaging. This validates the ability to quantitate atherosclerotic plaque burden and intraplaque composition against histopathology in cadaveric human aortae.

Although intravascular MRI is emerging as a valuable tool for studying aortic disease, in vivo human studies must await proper safety testing and regulatory approval.

There has been considerable interest on factors influencing atherosclerotic plaque stability. Plaque composition may predict plaque stability, and interventions that alter plaque composition may change the likelihood of plaque rupture and clinical events. Ferrari, E., et al., Atherosclerosis of the thoracic aorta and aortic debris as a marker of poor prognosis: benefit of oral anticoagulants, *J Am Coll Cardiol.*,vol. 33,pp. 1317–22, 1999, discloses that these hypotheses are supported by indirect evidence, although direct testing in vivo has not been possible.

The thoracic aorta represents a valuable window for the study of atherosclerotic plaque burden and vulnerability. See, for example, Fazio, G. P., et al.; Amarenco, P., et al., Atherosclerotic disease of the aortic arch and the risk of ischemic stroke, *N Engl J Med.*, vol 331,pp. 1474–79, 1994; Cohen, A., et al., Aortic plaque morphology and vascular events: a follow-up study in patients with ischemic stroke. FAPS Investigators. French Study of Aortic Plaques in Stroke, *Circulation,* vol. 96, pp. 3838–41, 1997; and Witteman, J. C., et al., Aortic calcified plaques and cardiovascular disease (the Framingham Study), *Am J Cardiol,* vol. 66, pp. 1060–64, 1990.

The prior art also shows that atherosclerotic disease of the thoracic aorta predicts cerebrovascular events, coronary disease/events, and death.

Without invading a vascular space, it is known to obtain similar information by receiving the signal from an adjacent body structure. The concept of placing a radio frequency (RF) receiver coil into a body cavity in order to image an adjacent structure by MR is disclosed by Narayan, P., et al., Transrectal probe for 1H and 31P MR spectroscopy of the prostate gland, *Magn. Reson. Med.,* vol. 11,pp. 209–20, 1989 (an endorectal RF receiver coil is employed to image the canine prostate); and by Schnall, M. D., et al., Prostate: MR imaging with an endorectal surface coil, *Radiology,* vol. 172, pp. 570–74, 1989 (an expandable endorectal RF receiver coil is employed to image the prostate in 15 humans having biopsy proven prostate carcinoma and two normal volunteers).

U.S. Pat. No. 5,348,010 discloses a rectal MRI receiving probe for use in imaging the prostate.

It is known to employ an endovaginal coil to image the vagina and adjacent structures. See, for example, Siegelman, E. S., et al., High-resolution MR imaging of the vagina, *Radiographics,* vol. 17,pp. 1183–1203, 1997.

U.S. Pat. No. 5,355,087 discloses the use of a probe in MRI or spectroscopy related to either the prostate or cervix. An RF receiving coil is inserted into the rectum or vagina in effecting these respective measurements.

It is also known to study the aorta by employing an expandable coil-type RF receiver in the inferior vena cava. See Martin, A. J., et al., An expandable intravenous RF coil for arterial wall imaging, *J Magn. Reson. Imaging,* vol. 8, pp. 226–34, 1998. While this approach avoids the need to invade the aorta, it necessitates placement of a large caliber central venous catheter, with associated risks.

U.S. Pat. No. 5,928,145 discloses magnetic resonance imaging (MRI) and spectroscopic analysis of small blood vessels using a flexible probe of relatively small dimension. A loopless antenna is employed wherein a coaxial cable is structured to be received within the intravascular system, a blood vessel such as a human vein, the femoral artery of a live rabbit for imaging the aorta thereof, a naturally occurring passageway in a human being, an opening of the pancreatic duct, or a tortuous passageway of a patient. In one embodiment, the optimal length of the antenna is about 7 cm to 10 cm and the loopless antenna has a maximum width of about 0.5 mm to 1.0 cm. Matching and decoupling circuits are employed. Preferably, the loopless antenna is flexible for purpose of movement in a tortuous path. U.S. Pat. No. 5,928,145 does not disclose any esophageal insertion of an antenna nor any insertion of an antenna in one body passageway to image body portions external to that passageway.

U.S. patent application Ser. No. 08/979,121 discloses the use of a body coil and support member and a catheter antenna employed for insertion into the body. An endoscope is inserted through the patient's mouth into the esophagus with an antenna in the form of a coaxial cable being delivered therethrough. The antenna is delivered to the esophagus by the endoscope which serves as a support surface therefor. Cylindrically encoded images are produced around the endoscope.

It is believed that an endoscope generally requires the sedation of the patient.

U.S. Pat. No. 5,699,801 discloses a flexible receiver coil for introduction into small blood vessels for purposes of accessing atherosclerotic areas. The receiver coil is introduced into or adjacent to the specimen, such as a patient. The coil is inserted within a catheter, an endoscope, a biopsy needle, or other probe-type medical devices.

U.S. Pat. No. 5,792,055 discloses the use of a coaxial cable functioning as an antenna in MRI procedures with particular emphasis on vascular uses.

U.S. Pat. No. 5,432,450 is directed toward an MRI probe having internal and external conductors.

U.S. Pat. No. 5,419,325 is directed to MRI and spectroscopy and discloses the use of a Faraday catheter inserted into a blood vessel of a patient.

U.S. Pat. No. 5,417,713 is directed toward a defribillating system for the heart which is inserted into the esophagus.

U.S. Pat. No. 5,211,166 discloses a biopsy needle or similar instrument or radiation-containing capsule, which is adapted to be detected by MRI procedures.

U.S. Pat. No. 4,572,198 discloses an MRI catheter which facilitates location of the catheter tip.

U.S. Pat. No. 5,170,789 discloses an insertable probe which has a two-component structure (i.e., a handle portion and an insertable portion having a coil). MRI and spectroscopy is employed to study deeply located organs, such as the rectum, colon, prostate, bladder, cervix and other tissue in close proximity to these or other internal organs.

The prior art shows that there is room for improvement in the known methods and apparatus for magnetic resonance imaging and spectroscopic analysis of the aorta and other intra thoracic anatomic structures.

SUMMARY OF THE INVENTION

As one aspect of the invention, a method of transesophageal magnetic resonance analysis comprises providing a loopless antenna; receiving a portion of the loopless antenna in a gastric tube; inserting the gastric tube which receives the loopless antenna in the esophagus of a patient; employing a matching and tuning circuit for the loopless antenna external to the patient; electrically connecting the matching and tuning circuit to a magnetic resonance scanner; and employing the magnetic resonance scanner for displaying an image of the aorta of the patient.

The gastric tube may be a Levin gastric tube. Preferably, the gastric tube is employed as a nasogastric tube, and transnasal placement of the nasogastric tube is employed in the esophagus of the patient.

As another refinement, the loopless antenna may be employed to confirm proper placement of the gastric tube in the esophagus of the patient.

As another aspect of the invention, a transesophageal magnetic resonance analysis apparatus comprises a loopless antenna having a proximal portion and a distal portion; a gastric tube for receiving the distal portion of the loopless antenna and for inserting the distal portion of the loopless antenna in the esophagus of the patient; a matching and tuning circuit having a first port and a second port which is electrically connected to the proximal portion of the loopless antenna; magnetic resonance scanner means for displaying an image of the aorta of the patient; and a cable electrically connecting the first port of the matching and tuning circuit to the magnetic resonance scanner means.

As a further aspect of the invention, a method of transesophageal magnetic resonance analysis of a patient comprises providing an antenna; receiving the antenna in a gastric tube; inserting the gastric tube which receives the antenna in the esophagus of the patient; employing a matching and tuning circuit for the antenna external to the patient; electrically connecting the matching and tuning circuit to a magnetic resonance scanner; and employing the magnetic resonance scanner for magnetic resonance imaging or spectroscopic analysis of an intra thoracic anatomic structure of the patient.

As another aspect of the invention, a transesophageal magnetic resonance analysis apparatus for a patient comprises an antenna; a gastric tube for receiving the antenna and for inserting the antenna in the esophagus of the patient; a matching and tuning circuit having a first port and a second port which is electrically connected to the antenna; magnetic resonance scanner means for magnetic resonance imaging or spectroscopic analysis of an intra thoracic anatomic structure of the patient; and a cable electrically connecting the first port of the matching and tuning circuit to the magnetic resonance scanner means.

These and other objects of the present invention will be more fully understood from the following description of the invention with reference to the illustration appended hereto.

DESCRIPTION OF THE PREFERRED EMBODIMENTS

As employed herein, the term "loopless antenna" shall expressly include, but not be limited to, a dipole antenna and any and all equivalents thereof, such as, for example, a dipole antenna having two poles at least one of which includes a mechanical loop (see, e.g., FIG. 14 of U.S. Pat. No. 5,928,145).

As employed herein, the term "antenna" shall expressly include a loopless antenna and any other imaging or spectroscopic analysis antenna, coil (i.e., having one turn) to or solenoid coil (i.e., having plural turns) which may be received by a gastric tube and which may receive an RF signal of appropriate frequency.

As employed herein, the term "non-loopless antenna" shall expressly include any antenna, other than a loopless antenna, which may be received by a gastric tube and which may receive an RF signal of appropriate frequency.

As employed herein, the term "patient" shall mean human beings and other members of the animal kingdom.

Figure 1A:
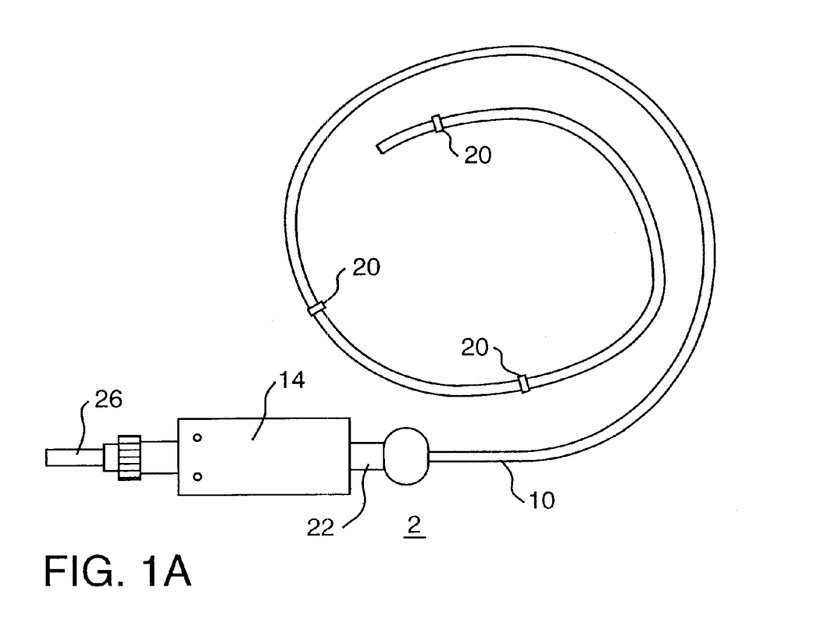
FIG. 1A is an isometric view of a transesophageal magnetic resonance imaging (TEMRI) device in accordance with the invention.

Referring to FIG. 1A, a loopless RF receiver device in the form of the exemplary transesophageal MR imaging (TEMRI) device 2 is shown. The TEMRI device 2 is designed for ease of placement into the esophagus of a patient for imaging of the adjacent aorta. Also referring to FIG. 1B, the exemplary device 2 includes a loopless RF receiver antenna 4 constructed from a flexible 0.047 inch diameter 50 Ω coaxial cable 6, with a 10 cm extension 8 of the center conductor at the distal end. The antenna 4 is secured within a modified Levin-type gastric tube 10. A tuning, matching and decoupling (TMD) circuit 12 is enclosed in an exemplary aluminum box 14. Although an aluminum box is disclosed, any non-ferromagnetic enclosure (e.g., copper) may be employed. The coaxial cable 6 is connected to the TMD circuit 12 which lies outside the patient's body. Decoupling is provided by high-speed diode switching of diode 16 during external RF pulses from a suitable MRI scanner 18. This prevents the antenna 4 from receiving during external RF pulses, yet allows signal reception between pulses. In the exemplary embodiment, the housing of the gastric tube 10 is 12 French in diameter, although other sizes are possible.

Figure 1B:
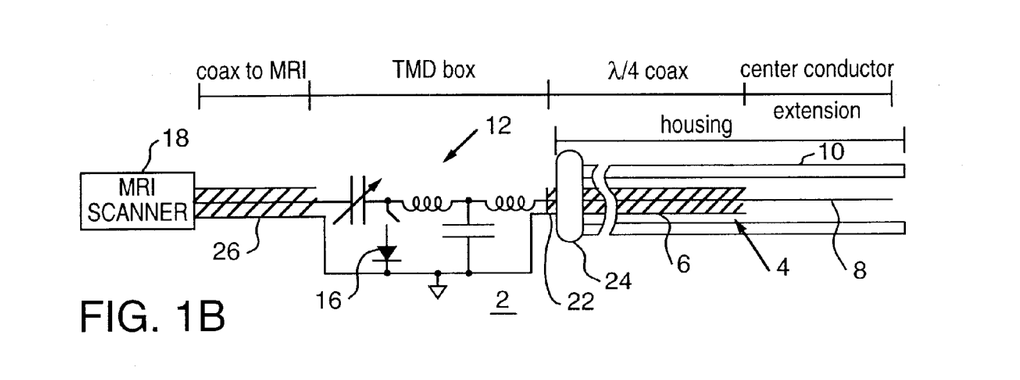
FIG. 1B is a schematic diagram of the TEMRI device of FIG. 1A.

The present invention exploits the proximity of the esophagus and the descending thoracic aorta, which are directly juxtaposed throughout the length of the descending thoracic aorta. By employing the gastric tube 10, the loopless RF antenna 4 may be passed down the esophagus of a non-sedated patient such as a human or another suitably large animal. In turn, the antenna 4 provides information comparable to that obtained with intravascular MRI and not obtainable by other non-invasive methods.

EXAMPLE 1

The exemplary transesophageal MRI (TEMRI) antenna 4 is based upon the design and construction of the MRIcompatible loopless RF receiver antenna disclosed in U.S. Pat. No. 5,928,145; and Ocali, O., et al., Intravascular magnetic resonance imaging using a loopless catheter antenna, *Magn. Reson. Med.,* vol. 37, pp. 112–18, 1997, except that the antenna 4 is designed to fit and operate inside a modified Levin gastric tube 10 (e.g., marketed by Sherwood Medical, St. Louis, Mo.). Exemplary sizes of the gastric tube 10 include 8 French (e.g., suitable for rabbit studies) or 12 French (e.g., suitable for obtaining images in mini-swine) as shown in FIG. 1A. The prior intravascular loopless catheter antenna has been used for in vivo intravascular imaging of rabbit aortae. See, for example, U.S. Pat. No. 5,928,145; Ocali, O., et al.

The exemplary TEMRI device 2 consists of a relatively thin coaxial cable 6 which is ≈λ/4 in length and which has a 10 cm extension 8 of the inner conductor at the distal end. The distal portion of the antenna 4 is housed inside the Levin gastric tube 10, which is modified by being suitably cut to adjust its length and being suitably marked (e.g., at 20 of FIG. 1A) to assist in proper esophageal placement. The proximal end 22 of the antenna 4 protrudes from the proximal end 24 of the Levin tube 10 at which point the two are secured together to prevent the antenna 4 from migrating out the end of the Levin tube housing 10. The proximal end 22 of the antenna 4 is connected to the adjustable TMD circuit 12, which, in turn, is connected via a coaxial cable 26 to the MRI scanner 18, such as a GE 1.5 Tesla MRI system.

As a further example, the exemplary TEMRI antenna may be employed in animals, such as a mini-swine (e.g., 35–45 kg) and a New Zealand white rabbit (e.g.,≈5 kg). Preferably, the animals are handled to ensure compliance with all relevant Federal regulations.

Transnasal esophageal placement of the TEMRI device 2 is confirmed, for example, by fluoroscopy in the case of the mini-swine. Tagged and non-tagged cine images are obtained in the manner disclosed in McVeigh, E. R., et al., Cardiac tagging with breath-hold cine MRI. *Magn. Reson. Med.,* vol. 28, pp. 318–27, 1992; and Zerhouni, E. A., et al., Human heart: tagging with MR imaging—a method for noninvasive assessment of myocardial motion, *Radiology,* vol. 169, pp. 59–63, 1988. Exemplary imaging parameters are discussed, below, in connection with FIGS. 2A–2C, and 3A–3D.

Figure 2A:
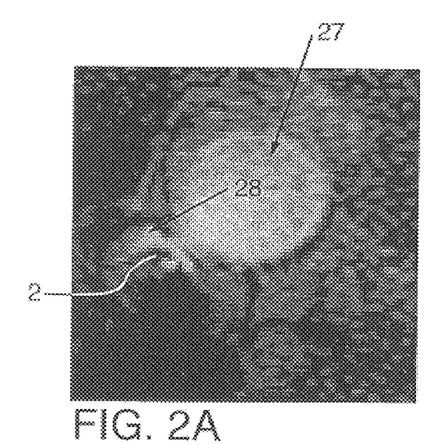
FIG. 2A is a representation of a transesophageal magnetic resonance tissue-tagged slice image.
Figure 2B:
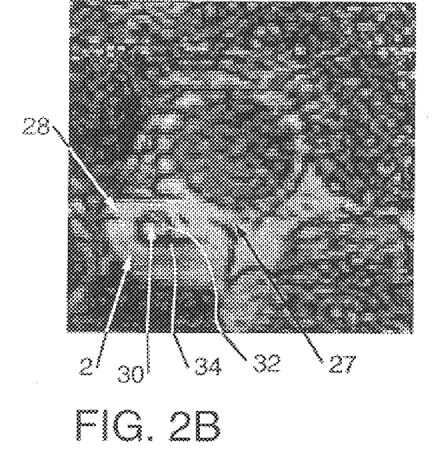
FIG. 2B is a representation of a transesophageal magnetic resonance tissue-tagged transverse image.
Figure 2C:
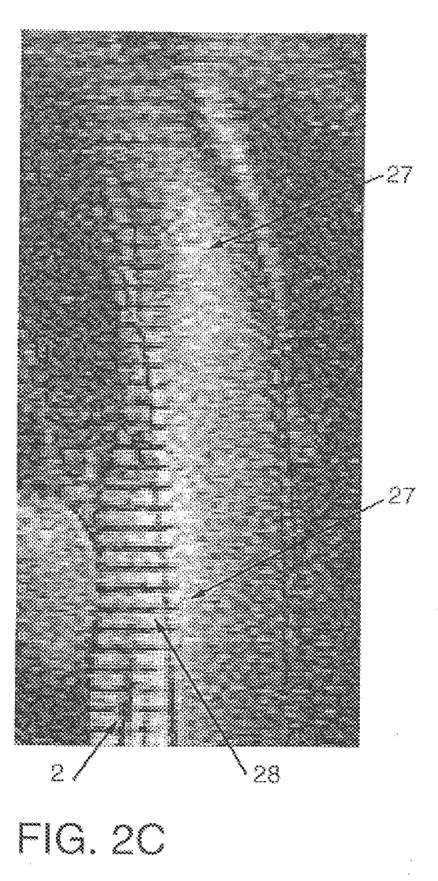
FIG. 2C is a representation of a transesophageal magnetic resonance tissue-tagged longitudinal image.

FIGS. 2A–2C represent images of the thoracic aorta 27 obtained by the TEMRI antenna device 2 of FIGS. 1A–1B in the esophagus 28 of a living, anesthetized mini-pig. Adjusting the imaging parameters of the MRI scanner 18 of FIG. 1B allows differentiation of the aortic wall from both surrounding tissues and intra-aortic blood. Images may be obtained with tissue-tagging, as in Zerhouni, E. A., et al., and ECG-gating at five frames per cardiac cycle, in order to demonstrate focal movement of the aortic wall in response to pulsatile blood flow, which reflects focal stress/strain relationships.

Exemplary imaging parameters common to FIGS. 2A–2C include: ECG-gated, segmented k-space, SPGR with HOT pulses (see, for example, Atalar, E., et al., Minimization of dead-periods in MRI pulse sequences for imaging oblique planes, *Magn. Reson. Med.,* vol. 32, pp. 773–77, 1994) at 10 cm FOV, 256×140 matrix, and flip=15°.

The image represented by FIG. 2A was obtained without tissue tagging. A short axis 7 mm slice was obtained 7.7 cm proximal to the probe tip, during a 27 s breath-hold, with number of excitations (NEX) 4, TR/echo time (TE) 7.7/2.2 ms, and 44 ms delay from QRS.

Tissue-tagged images were obtained with ECG-gating at 5 frames per cardiac cycle to allow direct visualization of aortic wall strain in response to pulsatile blood flow. FIGS. 2B and 2C represent 159 ms delay images from tissue tagged, ECG-gated cine-loops obtained at 44, 83, 121, 159, and 198 ms after detection of the QRS complex. Those images are transverse and longitudinal images, respectively, which were obtained using tissue tagging which appears as transverse lines of voided signal. The particular imaging parameters for FIG. 2B include: 7 mm thick, 7.7 cm proximal to the probe tip, during a 10 s breath-hold, with NEX 2, TR/TE 7.7/2.2 ms, and 159 ms delay from QRS. For FIG. 2C, the imaging parameters include: 3 mm thick, during a 28 s breath-hold, with NEX 6, TR/TE 8.7/2.6 ms, and 159 ms delay from QRS.

As shown in FIGS. 2A–2C, the location of the TEMRI probe 2 in each image representation is recognized by the characteristic appearance (FIG. 2B) of a small dark region reflecting the actual silver and copper coaxial RF receiver within the brightest region of the image. In some cases, a target appearance of the probe is evident. It is believed that this represents the (dark) metallic conductor 30 in the center, surrounded by gastric fluid (bright) 32, surrounded by plastic (dark) 34 from the modified Levin tube probe housing, all within the brightest region of the image. In practical terms, recognizing the location of the probe within the image is not difficult.

Referring to FIGS. 3A–3D, the TEMRI technique is also applied to a relatively smaller animal. An 8 French version (see the corresponding housing 68 of FIG. 5B) of the TEMRI antenna is easily passed transnasally into the esophagus 36 of a living anesthetized rabbit. This allows imaging of the rabbit aorta 38, including the aortic wall 40, which is ≈0.2 mm thick. Representations of ECG-gated TEMRI images from the rabbit are obtained with a 61 ms delay from the detection of the QRS complex. Exemplary imaging parameters include: fast spin echo at 8 cm FOV, 256×256 matrix, and flip=15°.

Figure 3A:
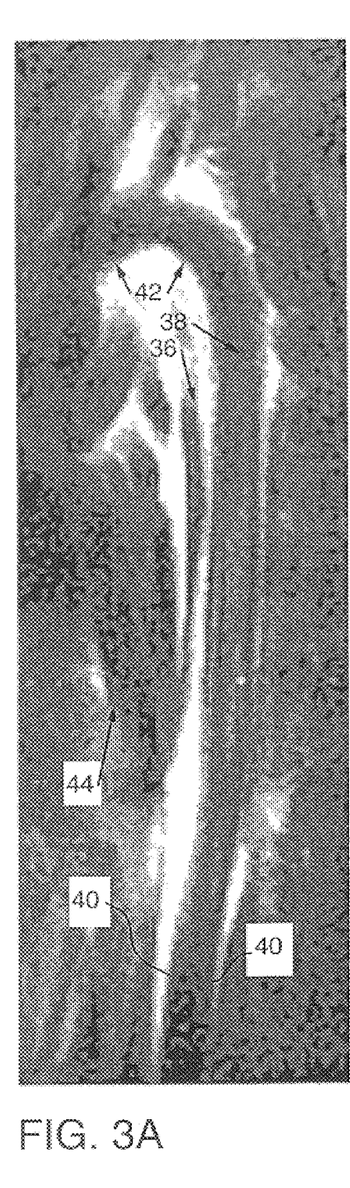
FIGS. 3A–3D are representations of transesophageal magnetic resonance images of the aorta of a rabbit.

FIG. 3A is a representation of an image in the form of a 3 mm longitudinal slice through the aorta 38 from the arch 42 to well below the diaphragm 44. Exemplary imaging parameters include: single breath-hold, NEX 8, and TR/TE 600/19.6 ms.

Figure 3B:
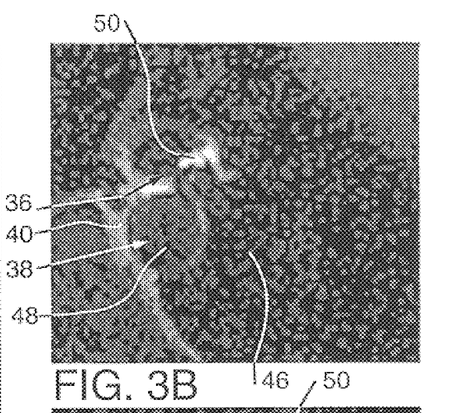
Figure 3C:
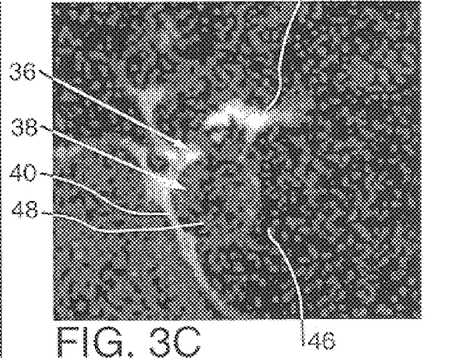
Figure 3D:
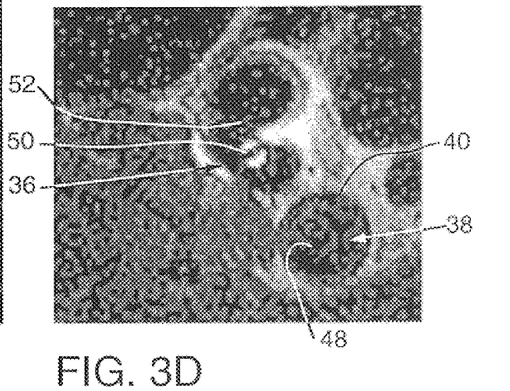

FIGS. 3B, 3C and 3D are representations of images in the form of 3 mm short axis slices at relatively high, middle, and low positions within the descending thoracic aorta 38 (e.g., 7.8 cm, 5.4 cm, and 4.6 cm from the distal tip of the probe, respectively). In FIGS. 3B and 3C, the aortic wall 40 separates lung 46 and aortic blood 48. This demonstrates that the TEMRI technique can resolve the aortic wall 40, which in a rabbit is ≅0.2 mm thick. In FIG. 3D, the TEMRI antenna device 50 is shown in the esophagus 36 at the gastroesophageal junction 52. Exemplary imaging parameters for these images include: single breath-hold, NEX 8, and TR/TE 600/11.8 ms.

The sensitivity of the exemplary TEMRI antenna decreases with the longitudinal distance from its receptive center and linearly with radial distance from the antenna, Ocali, O., et al., but is maintained at a reasonable level over a useful range. This is seen qualitatively as the brightness of the image representations in both their longitudinal and radial dimensions.

For applications in which the relative values of the signal intensities at two different locations are important, the image may be corrected after acquisition using a suitable algorithm in the MRI scanner which accounts for this property of the antenna.

EXAMPLE 2

Figure 4:
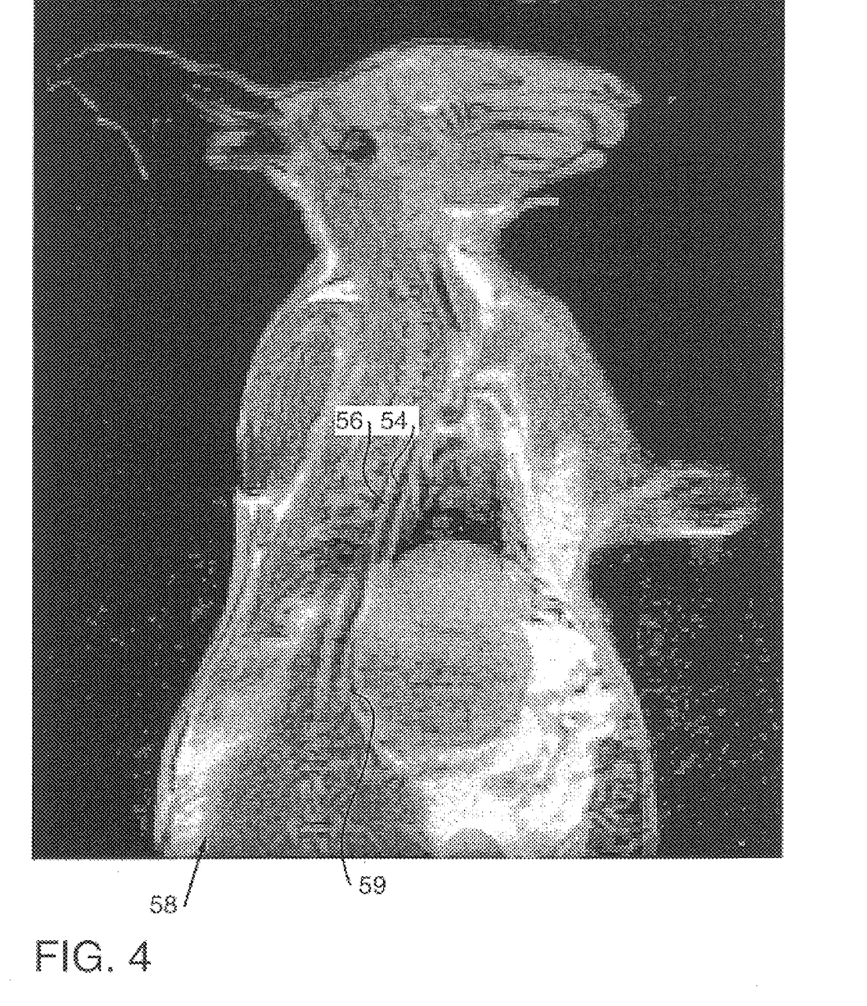
FIG. 4 is a representation of a standard body coil magnetic resonance image of a rabbit with the TEMRI device of FIG. 1A in position in the esophagus.

Referring to FIG. 4, standard MR (body coil) imaging may be employed while the TEMRI device 54 is in the esophagus 56. FIG. 4 shows a representation of the MR image of a rabbit 58 with the TEMRI device 54 in position in the esophagus 56. While the TEMRI device 54 was in place in the esophagus 56, standard MRI was performed. The exemplary imaging parameters in connection with FIG. 4 include: ECG-gated, fast spin echo at 28 cm FOV, 256× 256 matrix, 3 mm thick, single breath hold, NEX 2, and TR 2000. The presence of the TEMRI device 54 in the esophagus 56 did not interfere with the standard MR imaging, which can be used to confirm proper placement in the distal esophagus 59. Hence, this technique may be employed to verify proper position of the TEMRI device 54 within the distal esophagus 59.

As discussed above, TEMRI may be applied to the study of the thoracic aorta. This technique may also have application to studies of aortic atheroma size, morphology and composition. While these properties have previously been studied ex vivo and by intravascular MR (see, e.g., Martin, A. J., et al., *Radiographics,* vol. 17, pp. 189–202; Martin, A. J., et al., *J. Magn. Reson. Imaging,* vol. 5,pp. 93–100; Toussant, J. F., et al., Water diffusion properties of human atherosclerosis and thrombosis measured by pulse field gradient nuclear magnetic resonance, *Arterioscler. Thromb. Vasc. Biol.,* vol. 17, pp. 542–46, 1997; Toussant, J. F., et al., Magnetic resonance images lipid, fibrous, calcified, hemorrhagic, and thrombotic components of human atherosclerosis in vivo, *Circulation.,* vol. 94,pp. 932–38, 1996; Correia, C. L., et al; Toussant. J. F., T2-weighted contrast for NMR characterization of human atherosclerosis, *Arterioscler. Thromb. Vasc. Biol.,* vol. 15, pp. 1533–42, 1995), such properties cannot be measured as well by competing non-invasive techniques.

The exemplary TEMRI loopless antenna 4 of FIG. 1B has several advantages over other candidate TEMRI antenna designs which incorporate coils. First, while the coil design theoretically has a higher signal-to-noise ratio (SNR), this advantage only persists in the region immediately adjacent to the probe. See Atalar, E., et al.; Ocali, O., et al. In practice, a small caliber coil with a conductor separation of 1.5 mm will outperform a loopless receiver at <1 cm from the receiver. However, beyond 1 cm, the loopless design affords a higher SNR. This is because the SNR for a receiver coil decreases with the inverse square of the distance from the coil, but the SNR for a loopless receiver decreases with the linear inverse of the distance. This linear inhomogeneity of signal from a loopless receiver is quite predictable across the field of view and can be corrected to homogeneity after image acquisition with an appropriate algorithm as described in Atalar, E., et al. In principle, this allows a quantitative comparison of signal intensity between two pixels whose distances from the probe differ. However, as is the case with most diagnostic imaging modalities, limiting post-acquisition processing of the images may be preferable.

In addition, since coil receivers require capacitor components near the distal end of the device, a larger caliber is mandated and construction is more complex. See Atalar, E., et al.; Ocali, O., et al. Expandable coils can extend the range over which a coil design outperforms a loopless receiver by increasing the diameter of the coil (see, e.g., Schnall, M. D., et al., *Radiology,* vol. 172, pp. 570–74; Siegelman, E. S., et al.; and Martin, A. J., et al., *J. Magn. Reson. Imaging,* vol. 8, pp. 226–34), however, they add further to the complexity of device design and placement. Thus, for imaging the human aorta which is normally 2–3 cm in diameter, and which is immediately adjacent to the esophagus, a loopless RF receiver sacrifices little, if anything, to the coil receiver in terms of performance, yet is simpler to construct and use.

EXAMPLE 3

Figure 5A:
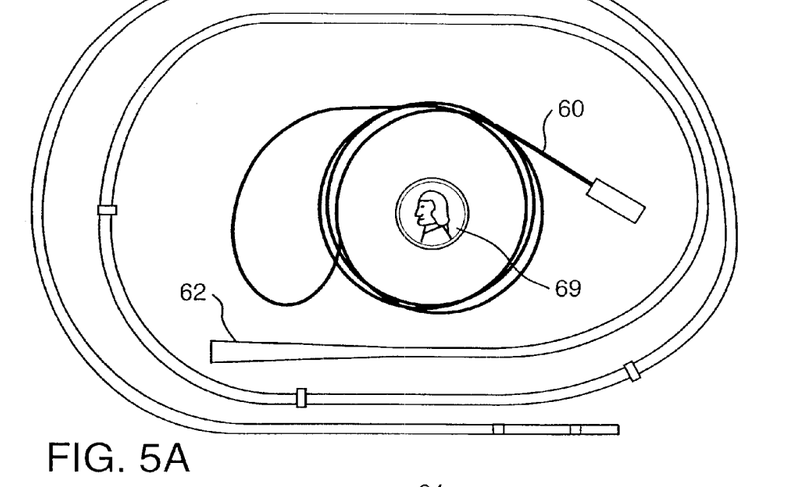
FIG. 5A is an isometric view of a TEMRI antenna and gastric tube in accordance with another embodiment of the invention.

For use in human subjects, a suitable TEMRI antenna device includes a 1.2 mm diameter loopless antenna receiver 60 for housing by a modified 12 French Levin gastric tube 62 as shown in FIG. 5A. This device may be positioned in the human esophagus by a standard nasogastric tube placement technique (e.g., to measure the proper position externally, mark the device, then pass it to the pre-marked level). Proper position may then be confirmed either by a rapid external body coil image, such as employed with the rabbit 58 of FIG. 4, or by MRI fluoroscopy techniques (see, e.g., Atalar, E., et al., Catheter-tracking FOV MR fluoroscopy, *Magn. Reson. Med.,* vol. 40(6), pp. 865–72, 1998).

Figure 5B:
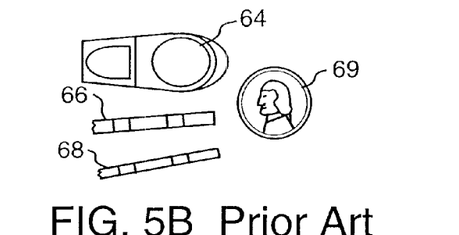
FIG. 5B is a plan view of a transesophageal echocardiography (TEE) probe, a 12 French (i.e., 4 mm outer diameter) gastric tube and an 8 French (i.e., 2.67 mm outer diameter) gastric tube.

The advantage of a simple, relatively small caliber device, such as the loopless TEMRI device 2 of FIGS. 1A and 1B, lies as much in practical issues as with theoretical concerns. As shown in FIG. 5B, in contrast to a TEE probe 64, a nasogastric tube, such as 66,68 (e.g., 12 French, 8 French, respectively) is relatively small and can be passed transnasally into proper position in the esophagus of a cooperative, conscious patient. A nickel coin ($0.05) 69 is shown for size comparison in FIGS. 5A and 5B.

Once the TEMRI antenna, which is housed by the nasogastric tube, is in position, no further manipulation of the TEMRI device is required in order to obtain different views. The net result is a decreased requirement for highly trained technical expertise in order to place the TEMRI device and, further, there is no need for sedation of the patient. This approach also avoids the need for a large caliber central venous catheter as is required by the transvenous approach. Although a nasogastric tube is disclosed, an orogastric tube may be employed. However, nasogastric placement is generally better tolerated by the patient.

Previous investigators have suggested that aortic atherosclerosis, as detected by TEE, can serve as a surrogate marker for coronary atherosclerosis. See, for example, Matsumura, Y., et al., Atherosclerotic aortic plaque detected by transesophageal echocardiography: its significance and limitation as a marker for coronary artery disease in the elderly, *Chest,* vol. 112, pp. 81–86, 1997; Khoury, Z., et al., Frequency and distribution of atherosclerotic plaques in the thoracic aorta as determined by transesophageal echocardiography in patients with coronary artery disease, *Am. J Cardiol.,* vol. 79, pp. 23–27, 1997; and Fazio, G. P., et al., Transesophageal echocardiographically detected atherosclerotic aortic plaque is a marker for coronary artery disease,*J. Am. Coln Cardiol,* vol. 21, pp. 144–50, 1993.

Fazio et al. employed TEE to study a diverse group of 61 patients scheduled for coronary angiography and found 95% and 82% positive and negative predictive values, respectively, for the ability of aortic atherosclerosis on TEE to predict a significant coronary lesion (i.e., 70% stenosis of a major coronary artery or 50% stenosis of the left main coronary artery). In more defined populations, Matsumura, Y., et al. (the specificity was only 55% and 10% in the subgroups under or over age 70, respectively), and Khoury, Z., et al. (the specificity was 77% and 40% in subgroups under or over age 64, respectively), both found 93% sensitivities of TEE for predicting the presence of $\geq$50% stenosis of a major coronary artery as determined at coronary angiography, but the specificities were poor.

Montgomery, D. H., et al. discloses TEE to follow the natural history of aortic atheromatous disease. While the overall severity of atherosclerosis may not significantly change over time, individual lesions are sporadically active and have a high likelihood of worsening or regressing over time. This reinforces the current consensus view of Libby, P., that while atherosclerosis may be slowly progressive, it is so only because the sum of the activities in each individual lesion is slowly progressive. Many clinical events, in fact, likely result from a single plaque catastrophe.

Other investigators have employed TEE to image aortas in patients with familial hypercholesterolemia before and after a trial of strict cholesterol-lowering therapy, using biplane TEE and semiquantitative scores of both atheroma burden and circumferential aortic wall stiffness. They have found a decrease in both after therapy. See Tomochika, Y., et al., Improvement of atherosclerosis and stiffness of the thoracic descending aorta with cholesterol-lowering therapies in familial hypercholesterolemia, *Arterioscler. Thromb. Vasc. Biol,* vol. 16, pp. 955–62, 1996.

For this important need of monitoring response to anti-atherosclerotic therapy, TEMRI has several potential advantages over TEE. First, the corresponding probe is smaller (as shown in FIG. 5B) and can be passed in the same manner as a standard nasogastric tube (i.e., by a well-trained nurse with neither sedation nor the additional monitoring which conscious sedation mandates). Second, MRI-based techniques more readily allow registration of images to a fixed frame of reference than does TEE, since the absolute position of each MRI slice is known and can be related to the locations of anatomic landmarks. Since TEE requires manual aiming of the ultrasound beam at an object of interest, the probe position is not a fixed point of reference. Thus, unless two referenced landmarks are visible in the same TEE field of view as an object of interest, the object's position in space cannot be determined precisely. This makes TEE an imperfect tool for monitoring the fate of a particular atherosclerotic plaque over time, particularly in areas with many plaques and few landmarks. Third, MRI provides more lesion detail and information about plaque composition. See, for example, Yuan, C., et al., In vitro and in situ magnetic resonance imaging signal features of atherosclerotic plaque-associated lipids, *Arterioscler. Thromb. Vasc. Biol,* vol 17, pp., 1496–503, 1997. Plaque composition is a strong predictor of plaque stability and, therefore, clinical events. Finally, with the use of tissue-tagging and ECG-gated cine-loop acquisition, TEMRI potentially provides a tool for measuring focal changes in wall stiffness, which is perhaps the most sensitive indicator of pre-clinical disease or response to therapy.

TEMRI may also be employed for quantitating thoracic aortic atherosclerosis in comparison with TEE and surface-coil MRI. TEMRI is not only useful in animals, but may also be employed to image the thoracic aorta in human subjects with and without aortic atherosclerosis.

In terms of safety, the potential for heating of a TEMRI antenna device within a patient is the primary concern. Whether the energy from the currents induced in the loopless antenna is of sufficient magnitude to produce a significant local temperature increase and a subsequent thermal tissue injury depends upon the switching, or "decoupling", efficiency of the TMD circuit 12 of FIG. 1B. The TMD circuit 12 is designed to turn off RF reception during external RF pulses. Intrinsic to the MRI magnet (not shown) of the MRI scanner 18 is a feature which detects a change in the bias current used to decouple the antenna 4. If the scanner 18 detects a change in this bias current, then the scanner 18 alarms that condition and shuts down the pulse sequence. For example, this safety feature may be triggered during a deliberate attempt to operate the TEMRI device in a phantom with the decoupling disabled. However, known studies in animals and phantoms have not triggered that safety feature during the time when the decoupling feature of the TMD circuit 12 was enabled.

Furthermore, at the end of certain studies, the animal under study was sacrificed and its aorta and esophagus were harvested en bloc for gross and microscopic histopathologic examination by an expert pathologist for evidence of tissue injury using standard hematoxylin and eosin stains. The absence of evidence of thermal injury to either pig or rabbit esophagus during known studies appears to confirm that decoupling is efficient. Hence, this provides a preliminary indication that TEMRI is likely to be safe.

EXAMPLE 4

High-resolution images of the thoracic aortic wall were obtained by TEMRI in 20 human subjects including seven normal controls and thirteen with aortic atherosclerosis. In eight subjects, the wall thickness and circumferential extent of thickening as measured by TEMRI was compared with such measurements from TEE. TEE provided a relative underestimation of circumferential extent. The SNR of TEMRI versus the SNR of surface-coil MRI were compared in different regions of the descending thoracic aortic wall, with the SNR advantage of TEMRI being better by a factor of 1.6 to 6.0. Based upon these studies, TEMRI provides superior results to those of surface-coil MRI and TEE for quantitative assessment of thoracic aortic atherosclerotic plaque burden. Furthermore, TEMRI is a feasible method of studying morphological detail within atherosclerotic plaques, without the need to invade a vascular space.

EXAMPLE 5

Figure 5C:
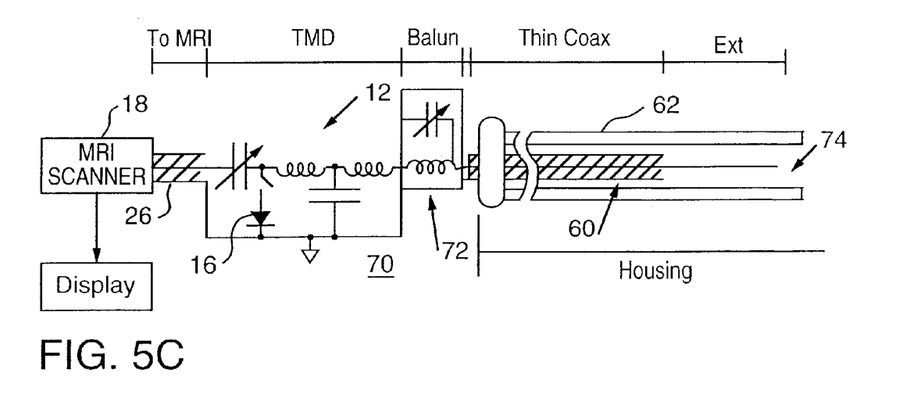
FIG. 5C is a schematic diagram of a TEMRI device which includes the TEMRI antenna and gastric tube of FIG. 5A.

FIG. 5C is a schematic diagram of a transesophageal magnetic resonance imaging device 70. The TEMRI loopless antenna receiver 60 is connected via TMD circuit 12 and coaxial cable 26 to the MRI scanner 18. A suitable balun circuit 72 is preferably interposed between the TMD circuit 12 and the receiver 60 to block the transmission of unbalanced currents toward the receiver 60 and, thus, the patient (not shown). In theory, without the balun circuit 72, if the MRI connector cable 26 is inadvertently left in a loop configuration during scanning, then, in principle, induced currents might heat the TEMRI device 70 and, thus, cause that heat to be transmitted to the patient. Although the exemplary TEMRI antenna device 70 is not completely sealed at the antenna end 74, a sealed TEMRI device may also be employed.

EXAMPLE 6

The exemplary TEMRI device 70 of FIG. 5C may be placed transnasally into the esophagus and stomach of the human subject using topical benzocaine spray as needed. Proper positioning may be confirmed by auscultation and aspiration. For subjects who might become claustrophobic in the magnet (not shown) of the MRI scanner 18, intravenous midazolam may be administered in order to continue the study. MR imaging studies were performed with a GE 1.5T magnet, using the magnet coil to transmit, and the TEMRI loopless antenna receiver 60 to receive the signal. In some cases, the TEMRI device 70 may be arrayed with a surface-coil (e.g., 5×11 inch rectangular coil; GE FlexCoil). Specific imaging parameters are discussed below in connection with FIGS. 6A–6F.

The first eight subjects for whom a contemporaneous TEE was available were analyzed quantitatively. A TEMRI slice through the thoracic aorta perpendicular to blood flow was analyzed from each subject using suitable software (e.g., NIH image 1.62 for Macintosh). Aortic wall thickness, excluding adventitia, was measured to determine maximum and minimum.

In addition, slices from normal subjects were measured in arbitrary locations to generate a population of 84 wall thickness measurements; the mean and standard deviation (SD) were 1.03±0.32 mm. A thickness of ≧2.0 mm (mean+3 SDs) was defined as being abnormal. The extent of atherosclerosis was defined as the number of degrees ≧2.0 mm thick.

For paired TEE measurements, the resulting video was reviewed, allowing forward, reverse and pause. The reviewer's time-integrated interpretation of aortic wall was traced over a calibrated transparency to determine maximum and minimum wall thickness and extent of thickening.

Figure 6A:
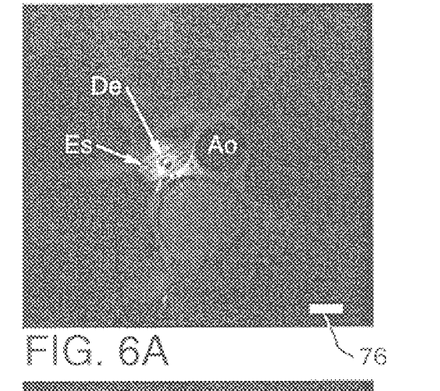
FIG. 6A is a representation of an image of the descending thoracic aorta of a healthy human, obtained from the TEMRI device of FIG. 5A in position in the esophagus.
Figure 6B:
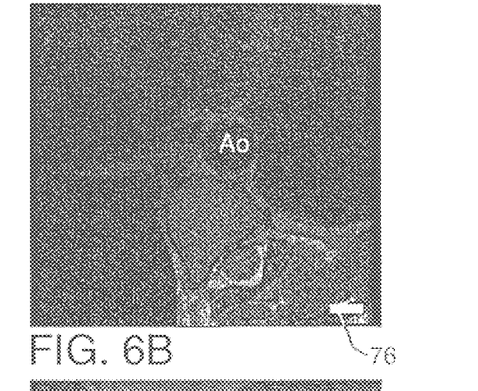
FIG. 6B is a representation of an image of the descending thoracic aorta of the human from FIG. 6A, obtained from an MRI coil on the patient's back.
Figure 6C:
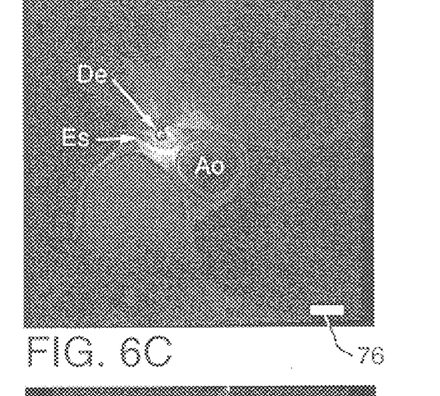
FIG. 6C is a representation of an image of a descending thoracic human aorta in which there is diffuse thickening with a smooth surface contour and without plaque tissue heterogeneity, obtained from the TEMRI device of FIG. 5A in position in the esophagus.
Figure 6D:
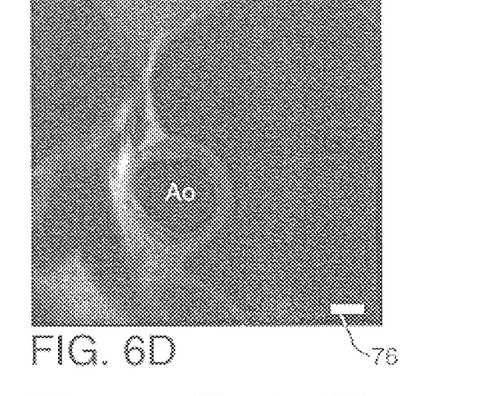
FIG. 6D is a representation of an image of the distal aortic arch of an elderly human having a remote stroke, obtained from the TEMRI device of FIG. 5A in position in the esophagus.

Representations of in vivo images are shown in FIGS. 6A, 6C and 6D of a human thoracic aorta Ao as obtained by a TEMRI antenna device De in the esophagus Es. Imaging parameters include: a single breath, ECG-gated, fast spin echo, blood suppression, and 12 cm FOV. The length of the reference bar 76 in FIGS. 6A–6E is 1 cm.

FIGS. 6A and 6B (i.e., slice thickness 3 mm, TE 40 ms, NEX 2) show the descending thoracic aorta Ao of a normal 24 year old female as obtained simultaneously from TEMRI and from a GE FlexCoil on the patient's back, respectively. These demonstrate the relative SNR advantage of TEMRI.

To quantitate this SNR advantage, SNR was measured directly (e.g., Constantinides, C. D., et al., Signal-to-noise measurement in magnitude imaging from NMR phased arrays, *Magn Reson Med.*, vol. 38, pp. 852–57, 1997) in images from a thin subject with aortic atherosclerosis, in order to bias the comparison against TEMRI. The distance from the receiver De to the aortic wall nearest the esophagus Es was 8.4 mm by TEMRI and 86.3 mm by surface-coil MRI. The corresponding SNRs were 124.4 and 20.5, respectively, which provided a 6-fold advantage in TEMRI. At the aortic wall furthest from the esophagus Es, those distances were 29.3 mm and 78.8 mm and the SNRs were 23.3 and 14.9, respectively, which provided a 1.6-fold advantage in TEMRI.

Figure 6E:
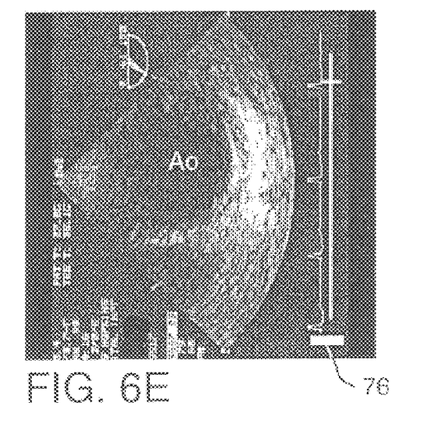
FIG. 6E is a representation of an image of the distal aortic arch of the human of FIG. 6D, obtained from a TEE probe in position in the esophagus.

The representation of the TEE image in FIG. 6E illustrates three of its important limitations for aortic plaque imaging: (1) the aortic wall is not imaged in its 360° entirety due to near field effects, resulting in underestimation of disease extent (see FIG. 6F) (e.g., well over one third of the aortic circumference is not adequately assessed for measurements as simple as aortic wall thickness); (2) image quality is sensitive to the quality of esophageal contact, which is often difficult to obtain at certain anatomic locations such as at the aortic arch; and (3) tissue characterization is limited. The extent to which the real-time motion feature of TEE can overcome these limitations remains subjective. For example, in comparisons, the user may employ that potential advantage of TEE by reviewing video in motion and, then, by synthesizing the visual information into a single interpretive tracing of the aortic wall.

FIG. 6C represents a TEMRI image (5 mm thick, TE 10 ms, 8 NEX) of the descending thoracic aorta Ao of a 58 year old female with a recent transient ischemic attack (i.e., "mini-stroke"). This image representation demonstrates diffuse thickening with a smooth surface contour and without plaque tissue heterogeneity.

FIGS. 6D and 6E represent TEMRI and TEE images (10 mm thick, TE 15 ms, 4 NEX), respectively, from the distal aortic arch of a 78 year old male with a remote stroke. These demonstrate circumferential atherosclerotic thickening with tissue heterogeneity consistent with intraplaque calcification or hemorrhage (e.g., Correia, L. C. L., et al., Intravascular magnetic resonance imaging of aortic atherosclerotic plaque composition, *Arterioscler. Thromb. Vasc. Biol.,* vol. 17, pp. 3626–32, 1997).

Figure 6F:
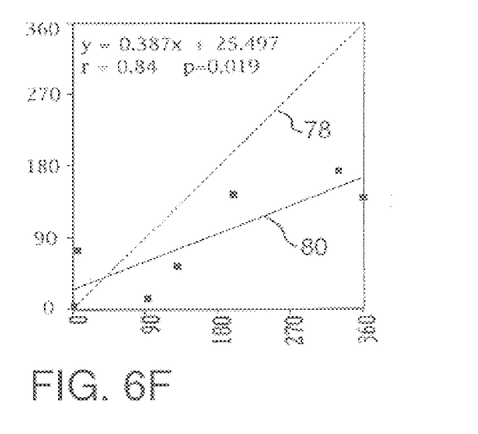
FIG. 6F is a plot of the relationship between measured circumferential extent of $\geq 2.0$ mm aortic wall thickening assessed by TEE (y-axis) with respect to TEMRI (x-axis)

TEMRI was compared to TEE for quantitative assessment of atherosclerosis in the thoracic aorta. The maximum and minimum wall thicknesses were 3.5±1.2 mm and 1.2±0.8 mm, respectively, by TEE; and 3.3±1.5 mm and 1.0±0.7 mm, respectively, by TEMRI. Similarly, the circumferential extent of atherosclerosis was measured by both techniques. As shown in FIG. 6F, the relationship between measured circumferential extent of ≧2.0 mm aortic wall thickening (degrees) assessed by TEE (y-axis) is plotted with respect to TEMRI (x-axis). The identity line 78 and the best-fit line 80 through the data points are shown. While the exemplary correlation is good (i.e., r=0.84, p=0.019), relative underestimation of the extent of disease by TEE was reflected by the slope (i.e, 0.387) of the best-fit line through paired measurements.

The feasibility of high-resolution MRI of the thoracic aortic wall and its atherosclerotic lesions has been demonstrated in human subjects in vivo by TEMRI. TEMRI provides a higher SNR than does surface-coil MRI. TEMRI also provides more complete information and morphologic detail within atherosclerotic plaques than does TEE. The exemplary loopless antenna design provides an imaging range well suited for imaging the aorta from the esophagus. In contrast to a TEE probe, the TEMRI probe is relatively small and can be passed transnasally in an unsedated patient. Once the device is positioned, multiple views can be obtained without further manipulation. Because sedation is not required, the need for additional nursing monitoring and for the presence of a highly trained operator during imaging may prove unnecessary.

Despite its limitations, TEE provides useful information about the aortic wall which likely mirrors the coronaries. See Witteman, J. C., et al., *Am J Cardiol,* vol. 66,pp. 1060–64. Montgomery, D. H., et al., *J Am Coll Cardiol.,* vol. 27, pp. 95–101, follows the natural history of aortic atherosclerosis by TEE and finds no significant change in overall severity, but a high likelihood for individual lesions to worsen or regress. This supports the hypothesis that plaque turnover rates (i.e., rupture followed by passivation) may be significant. TEMRI may, thus, have several potential advantages over TEE for monitoring plaque behavior. First, TEMRI allows imaging in any plane with precise registration to a fixed frame of reference. Since TEE requires manual aiming, the probe is not a fixed reference point, making TEE an imperfect tool for this purpose, particularly in areas with many plaques and few anatomic landmarks. Second, TEMRI offers information about plaque composition which cannot be assessed as well by ultrasound-based techniques (e.g., Correia, L. C. L., et al.; Martin, A. J., et al., *Radiographics,* vol. 17, pp. 189–202; Yuan, C., et al., *Arterioscler Thromb Vasc Biol.,* vol. 17, pp. 1496–503) and may predict plaque stability. It is believed that serial TEMRI studies to monitor atherosclerotic plaques and their response to pharmacologic interventions may be beneficial.

In conclusion, TEMRI is superior to TEE in the quantification of atherosclerotic plaque extent in the thoracic aorta, and can be performed in combination with surface-coil MRI. Specifically, the TEMRI assessment of plaque extent is comprehensive since the entire circumference of the aorta can be visualized at any level and orientation as desired by the operator. Moreover, the relationship of individual plaques to structural landmarks is straightforward, making it ideal for follow-up studies given its minimally invasive nature and the lack of a need for sedation with its inherent risks and costs. Finally, the potential for detailed assessment of plaque composition in the near future makes TEMRI an important addition to cardiovascular medicine and clinical investigation.

EXAMPLE 7

Figure 7:
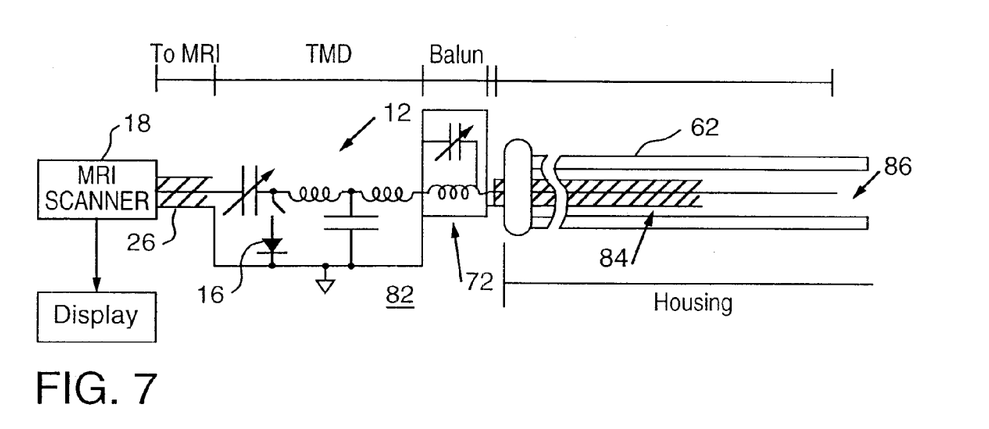
FIG. 7 is a schematic diagram of a TEMRI device in accordance with another embodiment of the invention which device includes a non-loopless antenna and a gastric tube.

FIG. 7 is a schematic diagram of another transesophageal magnetic resonance imaging device 82 which, except for receiver 84, is similar to the TEMRI device 70 of FIG. 5C. A suitable TEMRI non-loopless antenna receiver 84, such as a coil, is connected via balun 72, TMD circuit 12 and coaxial cable 26 to the MRI scanner 18. Although the exemplary TEMRI antenna device 82 is not completely sealed at the antenna end 86, a sealed TEMRI device may also be employed. As is well known, the MRI scanner 18 may be employed for magnetic resonance imaging or spectroscopic analysis of the patient.

In addition to analysis of the aorta, it is believed that TEMRI may be employed with other intra thoracic anatomic structures to: (1) image and perform spectroscopy of the coronary arteries and study blood flow velocity, the presence, size and composition of atherosclerotic plaques, and the presence of coronary artery aneurysms; (2) study the heart muscle and perform imaging and spectroscopy of the heart in situations of health and disease; (3) image the valves of the heart to detect valve malfunctions such as stenoses and regurgitant jets; (4) image and perform spectroscopy in masses and/or tumors involving the heart or contained within the heart chambers; (5) image and perform spectroscopy of the pericardium in states of heath and disease; (6) image the pulmonary artery for the detection of congenital or acquired disease and to detect the presence of thrombus or tumor within the main pulmonary frank and its branches; (7) image and perform spectroscopy of the mediastinum, lymph nodes and mediastinal masses; (8) image and perform spectroscopy of the lung tissues, lung tumors or other pulmonary processes including pleural diseases and tumors; (9) image and perform spectroscopy of thoracic osseous and/or cartilagenous normal and pathologic structures including tumors or masses involving the thoracic bones and cartilages; and (10) image and perform spectroscopy of any of the above anatomic structures in combination with standard and/or modified surface coil imaging and spectroscopy.

In summary, TEMRI provides information about the aorta, which is of clinical importance, and which is otherwise unobtainable without invading a vascular space. TEMRI is further employed in visualizing lesions of the aorta.

The exemplary non-invasive method of imaging the thoracic aorta provides both morphological detail within the aortic wall as well as information about regional aortic wall motion. The exemplary TEMRI devices 2,70,82 allow transesophageal MR imaging of the thoracic aorta This method has several advantages over the competing non-vasculoinvasive techniques of transesophageal echocardiography (TEE) or standard MRI. For example, use of the TEMRI devices 2,70,82 and TEMRI do not require a full invasive procedure and the associated sedatives. Furthermore, the thoracic aorta may be imaged in longitudinal and cross-sectional views, and details of the aortic wall being readily seen.

The TEMRI technique has direct application to studies of aortic atheroma size, morphology and composition. Those properties cannot be measured as well, or at all, by other known competing techniques. Non-invasive studies of, for example, changes in atherosclerotic plaques in response to pharmacologic interventions, may be considered using the TEMRI technique.

TEMRI also provides tissue tagging for measurement of focal stress/strain relationships. Furthermore, with the addition of ECG-gated cine tissue tagging, TEMRI offers the first known method of direct observation of regional stress/strain relationships in the aortic wall throughout the cardiac cycle.

Furthermore, TEMRM avoids the risks inherent in intravascular MRI, while providing comparable image quality.

Enhanced efficiency of TEMRI may be provided through the use of at least one of a balancing transformer and an impedance matching circuit.

While for clarity of disclosure reference has been made herein to an MRI scanner 18 for displaying an image, it will be appreciated that the image information may be stored, printed on hard copy, be computer modified, or be combined with other data. All such processing shall be deemed to fall within the terms "display" or "displaying" as employed herein.

Whereas particular embodiments of the present invention have been described above for purposes of illustration, it will be appreciated by those skilled in the art that numerous variations in the details may be made without departing from the invention as described in the claims which are appended hereto.

We claim:

1. A method of transesophageal magnetic resonance analysis of a patient having an esophagus and an aorta, said method comprising:
   providing a loopless antenna;
   receiving a portion of said loopless antenna in a gastric tube;
   inserting said gastric tube which receives said loopless antenna in the esophagus of said patient;
   employing a matching and tuning circuit for said loopless antenna external to said patient;
   electrically connecting said matching and tuning circuit to a magnetic resonance scanner; and
   employing said magnetic resonance scanner for displaying an image of the aorta of said patient.

2. The method of claim 1 including
   employing said loopless antenna at a position greater than 1 cm from said aorta.

3. The method of claim 1 including
   employing said aorta having an aortic wall and a diameter of about 2 to 3 cm; and
   employing said aortic wall adjacent to said esophagus.

4. The method of claim 1 including
   employing as said gastric tube a Levin gastric tube.

5. The method of claim 1 including
   employing as said gastric tube a nasogastric tube; and
   employing transnasal placement of said nasogastric tube in the esophagus of said patient.

6. The method of claim 1 including
   employing as said gastric tube a gastric tube having an outer diameter of 8 French or 12 French.

7. The method of claim 1 including
   employing as said gastric tube a gastric tube having a diameter suitable for insertion in the esophagus of said patient.

8. The method of claim 1 including employing a flexible coaxial cable having an extended inner conductor as said loopless antenna.

9. The method of claim 8 including outputting radio frequency pulses having a wavelength ($\lambda$) from said magnetic resonance scanner, and employing said flexible coaxial cable having a length of $\lambda/4$.

10. The method of claim 9 including employing the extended inner conductor of said flexible coaxial cable having a length of 10 cm.

11. The method of claim 1 including employing said loopless antenna having a distal portion and a proximal portion; positioning the proximal portion of said loopless antenna external to said patient; and receiving the distal portion of said loopless antenna inside said gastric tube.

12. The method of claim 1 including employing said loopless antenna having a distal end and a proximal end; employing said gastric tube having a distal end and a proximal end; positioning the distal end of said loopless antenna within said gastric tube; protruding the proximal end of said loopless antenna from the proximal end of said gastric tube; and securing the proximal ends of said gastric tube and said loopless antenna to prevent the distal end of said loopless antenna from moving out of the distal end of said gastric tube.

13. The method of claim 12 including electrically interconnecting the proximal end of said loopless antenna to said matching and tuning circuit; and employing a coaxial cable to electrically connect said matching and tuning circuit to said magnetic resonance scanner.

14. The method of claim 1 including adjusting said matching and tuning circuit.

15. The method of claim 1 including employing as said patient a non-sedated patient.

16. The method of claim 1 including employing as said patient a human being.

17. The method of claim 1 including employing as said patient an animal other than a human being.

18. The method of claim 1 including employing fluoroscopy to confirm proper placement of said gastric tube in the esophagus of said patient.

19. The method of claim 1 including employing said loopless antenna to confirm proper placement of said gastric tube in the esophagus of said patient.

20. The method of claim 1 including employing an image from an external body coil to confirm proper placement of said gastric tube in the esophagus of said patient.

21. The method of claim 1 including providing said gastric tube with visible markings; and employing said visible markings of said gastric tube to facilitate proper placement thereof in the esophagus of said patient.

22. The method of claim 21 including measuring external to said patient a position for said proper placement of said gastric tube in said esophagus before marking said gastric tube with said visible markings; and employing said visible markings to properly place said gastric tube in the esophagus of said patient.

23. The method of claim 1 including employing bias current to decouple said loopless antenna; detecting a change in said bias current; employing said magnetic resonance scanner to emit pulsed radio frequency signals; and disabling said pulsed radio frequency signals in response to said change in said bias current.

24. The method of claim 1 including employing said aorta having an aortic wall; employing blood within said aortic wall; and displaying an image of said aortic wall and said blood.

25. The method of claim 1 including displaying as said image a longitudinal view of said aorta.

26. The method of claim 1 including displaying as said image a cross-sectional view of said aorta.

27. The method of claim 1 including employing tissue-tagging or ECG-gating to display said image.

28. The method of claim 1 including employing said aorta having a wall; and demonstrating focal movement of the wall of said aorta in response to pulsatile blood flow which reflects focal stress/strain relationships.

29. The method of claim 28 including measuring said stress/strain relationships.

30. The method of claim 1 including employing said aorta having a wall; and providing morphological detail within the wall of said aorta.

31. The method of claim 1 including employing said aorta having a wall; and providing information about regional wall motion of said aorta.

32. The method of claim 1 including employing said aorta having a wall; employing blood within the wall of said aorta; employing tissues surrounding the wall of said aorta; adjusting imaging parameters of said magnetic resonance scanner; and differentiating the wall of said aorta from said tissues and said blood.

33. The method of claim 1 including employing said image of said aorta to evaluate size, morphology, and composition of said aorta.

34. The method of claim 1 including employing said magnetic resonance scanner to emit pulsed radio frequency signals to said aorta and to receive magnetic resonance signals from said loopless antenna; and employing diode switching in said matching and tuning circuit to decouple said loopless antenna during emission of said radio frequency pulses to said aorta, and to permit reception of said magnetic resonance signals between said radio frequency pulses.

35. A transesophageal magnetic resonance analysis apparatus for a patient having an esophagus and an aorta, said apparatus comprising:

a loopless antenna having a proximal portion and a distal portion;

a gastric tube receiving the distal portion of said loopless antenna and adapted to insert the distal portion of said loopless antenna in the esophagus of said patient;

a matching and tuning circuit having a first port and a second port which is electrically connected to the proximal portion of said loopless antenna;

magnetic resonance scanner means for displaying an image of said aorta of said patient; and a cable electrically connecting the first port of said matching and tuning circuit to said magnetic resonance scanner means.

36. The transesophageal magnetic resonance analysis apparatus of claim 35 including said magnetic resonance scanner means including means for emitting pulsed radio frequency signals; and said loopless antenna being formed from a coaxial cable having an outer shield and an inner conductor, with a portion of said outer shield and a portion of said inner conductor of said coaxial cable forming an antenna portion of said loopless antenna for receiving signals emitted from the aorta of said patient responsive to said pulsed radio frequency signals, and with another portion of said coaxial cable for emitting responsive output signals to the second port of said matching and tuning circuit.

37. The transesophageal magnetic resonance analysis apparatus of claim 35 including said coaxial cable includes a connection portion for emitting said responsive output signals.

38. The transesophageal magnetic resonance analysis apparatus of claim 35 including said gastric tube is a Levin gastric tube.

39. The transesophageal magnetic resonance analysis apparatus of claim 35 including said gastric tube is a nasogastric tube for transnasal placement in the esophagus of said patient.

40. The transesophageal magnetic resonance analysis apparatus of claim 35 including said loopless antenna includes a flexible coaxial cable having an extended inner conductor.

41. The transesophageal magnetic resonance analysis apparatus of claim 35 including said cable is a coaxial cable.

42. The transesophageal magnetic resonance analysis apparatus of claim 35 including said magnetic resonance scanner includes means for emitting pulsed radio frequency signals to said aorta and means for receiving magnetic resonance signals from said loopless antenna; and said matching and tuning circuit includes means for decoupling said loopless antenna during emission of said radio frequency pulses to said aorta, and for permitting reception of said magnetic resonance signals between said radio frequency pulses.

43. A method of transesophageal magnetic resonance analysis of a patient having an esophagus and an intra thoracic anatomic structure, said method comprising:

providing an antenna;

receiving said antenna in a gastric tube;

inserting said gastric tube which receives said antenna in the esophagus of said patient;

employing a matching and tuning circuit for said antenna external to said patient;

electrically connecting said matching and tuning circuit to a magnetic resonance scanner; and employing said magnetic resonance scanner for magnetic resonance imaging or spectroscopic analysis of the intra thoracic anatomic structure of said patient.

44. The method of claim 43 including employing as said antenna a non-loopless antenna.

45. The method of claim 44 including employing as said non-loopless antenna a receiver coil.

46. The method of claim 43 including employing as said intra thoracic anatomic structure an aorta.

47. The method of claim 43 including employing as said intra thoracic anatomic structure a structure selected from the list including: a heart tissue, a coronary artery, coronary blood, a coronary atherosclerotic plaque, a coronary artery aneurysm, a heart valve, a heart muscle, a heart tumor, a heart mass, a heart chamber, a pericardium, a pulmonary artery, a pulmonary thrombus, a pulmonary tumor, a mediastinum, a lymph node, a mediastial mass, a lung tissue, a lung tumor, a thoracic tumor, a thoracic mass, a thoracic bone, and a thoracic cartilage.

48. The method of claim 43 including employing surface coil imaging and spectroscopy.

49. A transesophageal magnetic resonance analysis apparatus for a patient having an esophagus and an intra thoracic anatomic structure, said apparatus comprising:

an antenna;

a gastric tube receiving said antenna and adapted to insert said antenna in the esophagus of said patient;

a matching and tuning circuit having a first port and a second port which is electrically connected to said antenna;

magnetic resonance scanner means for magnetic resonance imaging or spectroscopic analysis of said intra thoracic anatomic structure of said patient; and a cable electrically connecting the first port of said matching and tuning circuit to said magnetic resonance scanner means.

50. The transesophageal magnetic resonance analysis apparatus of claim 49 including said antenna is a non-loopless antenna.

51. The transesophageal magnetic resonance analysis apparatus of claim 50 including said non-loopless antenna is a receiver coil.

* * * * *

UNITED STATES PATENT AND TRADEMARK OFFICE
CERTIFICATE OF CORRECTION

PATENT NO. : 6,408,202 B1
DATED : June 18, 2002
INVENTOR(S) : Joao A.C. Lima et al.

It is certified that error appears in the above-identified patent and that said Letters Patent is hereby corrected as shown below:

Title page,
Item [56], References Cited, OTHER PUBLICATIONS,
"Schnall, M.D. et al." reference, delete the second instance of "with an endorectal".
"A.J. Martin, et al." reference, "imging" should read -- imaging --.
"Kasprzak, J.D., et al." reference, "thoracis" should read -- thoracic --.

Column 1,
Line 56, "sermi-" should read -- semi- --.

Column 3,
Line 13, "1H and 31P" should read -- $^1$H and $^{31}$P --.

Column 10,
Line 49, "*Coln*" should read -- *Coll* --.

Column 15,
Line 36, "frank" should read -- trunk --.
Line 57, insert a -- . -- after "aorta".

Column 16,
Line 12, "TEMRM" should read -- TEMRI --.

Signed and Sealed this

Twenty-eighth Day of February, 2006

JON W. DUDAS
*Director of the United States Patent and Trademark Office*